(12) United States Patent
Wong et al.

(10) Patent No.: US 6,255,845 B1
(45) Date of Patent: Jul. 3, 2001

(54) EFFICIENT USE OF SPARE GATES FOR POST-SILICON DEBUG AND ENHANCEMENTS

(75) Inventors: Jacques Wong, Santa Clara; David Chiang; Jaime Tolentino, both of Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/495,477

(22) Filed: Feb. 1, 2000

Related U.S. Application Data
(60) Provisional application No. 60/165,672, filed on Nov. 16, 1999.

(51) Int. Cl.[7] .................................................. H03K 19/173
(52) U.S. Cl. ................................. 326/38; 326/9; 326/101
(58) Field of Search ................................... 326/9, 10, 12, 326/13, 14, 37–41, 101, 102, 103

(56) References Cited

U.S. PATENT DOCUMENTS

| | | | |
|---|---|---|---|
| 3,937,936 | * 2/1976 | Saporito et al. | 326/10 |
| 4,899,067 | * 2/1990 | So et al. | 326/10 |
| 5,568,067 | 10/1996 | McDermott et al. | |
| 5,576,633 | * 11/1996 | Roundtree et al. | 326/10 |
| 5,592,107 | 1/1997 | McDermott et al. | |
| 5,687,387 | 11/1997 | Endejan et al. | |
| 5,696,943 | 12/1997 | Lee | |
| 5,959,905 | 9/1999 | Payne | |
| 6,166,559 | * 12/2000 | McClintock et al. | 326/10 |

* cited by examiner

Primary Examiner—Michael Tokar
Assistant Examiner—Don Phu Le

(57) ABSTRACT

A spare gate cell on a integrated circuit contains both a configurable logic gate and one or more inverters. Inputs of these circuits have an appearance, accessible by the automatic place-and-route tool, at the topmost metal layer on the integrated circuit, which is metal 3 or higher. The outputs of the circuit preferably are accessible up to the same metal layer. The combination of the configurable gate circuit and one or more inverters enables any one such cell to selectively implement a wide range of logic functions by making appropriate connections during fib-mill processing of the integrated circuit device. The use of interconnections at the topmost layer facilitates reconfiguring a circuit to implement desired logic and interconnection thereof into the pre-defined logic on the integrated circuit. The inventive spare gate cells provide a high degree of design flexibility, both for circuit debug operations and for implementation of enhanced logic functions.

24 Claims, 9 Drawing Sheets

EFFICIENT USE OF SPARE GATES FOR POST-SILICON DEBUG AND ENHANCEMENTS

RELATED APPLICATION

This application claims the benefit of U.S. Provisional Application No. 60/165,672, entitled "EFFICIENT USE OF SPARE GATES FOR POST-SILICON DEBUG AND ENHANCEMENTS" filed on Nov. 16, 1999, the disclosure of which is entirely incorporated herein by reference.

FIELD OF THE INVENTION

The present invention relates to spare gate cell circuitry and device structures and related integrated circuit processing techniques, for efficient use of spare gates. The inventive approach to spare gates facilities debugging of manufactured integrated circuit devices or initial implementations of logic enhancements of such devices.

BACKGROUND

The advent of Very Large Scale Integration (VLSI) technology has enabled integrated circuit manufacturers to develop ever more complex logic circuitry on ever-smaller areas of chip wafers. The increasing integration and logic complexity has led to rapid increases in circuit function and vast improvements in performance metrics. The fabrication of any complex integrated circuit device involves a series of process steps to develop transistors, capacitors, etc. on the silicon substrate, as well as a series of steps to apply metal layers (typically 2–4 to date) that form the necessary interconnections to provide the basic predefined logic functionality of the device. However, each new generation of circuit design initially exhibits problems or "bugs," and many circuit designs go through a series of debugs and logic enhancements before replacement with subsequent generation designs.

In cell-based integrated circuit design, for complex integrated circuits such as processors and the like, conventional metal-only repairs and upgrades use repair cells, which contain spare gates. Typically, these spare gate cells are randomly dispersed throughout the cells of the designed logic circuitry on the IC chip.

In many known spare gate designs, each spare gate cell includes a collection of transistors coupled together into a pre-defined logic gate, to thereby perform a certain function. The pre-defined spare gates can include gates having any of the functions common in logic gates (NAND, NOR, Inverter, flip-flop, etc.) that can be used in fixing function and timing errors using only metal interconnections to and among a selected number of spare gates. Using this debugging technique, the base set of logic components of the device does not change. Only the metal layers change to achieve the connections needed to add selected gates from the spare cells into the functional circuitry of the pre-defined logic. The inclusions of such spare gate cells within the chip layout enables logic changes, specifically by reconfiguring one or more of the spare gate resources to become part of the working logic of the IC chip. For a desired modification, engineers select a unique combination of gates, from available resources, which are expected to achieve a desired repair or enhancement of the overall logic function.

At present most such spare gate cells comprise relatively simple, single function gates. One class of such gates is combinatorial gates (AND, NAND, NOR, etc), and another class is sequential gates (flip-flops and the like). To facilitate the spare gate approach to debugging for processors or other complex integrated circuits, there is a need for maximum flexibility in the design of spare gate arrays. Single function spare gate cells, even if available in a wide variety of functions and in substantial numbers, may not provide sufficient flexibility to enable all desired logic changes, to debug a particular device or implement certain desired enhancements of the device.

Accordingly, there have been a number of recent suggestions to implement reconfigurable spare gates. For example, U.S. Pat. No. 5,592,107 to McDermott et al. suggests the use of a configurable NAND/NOR logic element in a spare gate cell; and related U.S. Pat. No. 5,568,067 to McDermott et al. suggests the use of a configurable XNOR/XOR logic element. Although somewhat configurable, by assertion or desertion of a control signal, this type of spare cell only provides limited design options because each spare cell includes only a single logic element having at most two possible configurations.

U.S. Pat. No. 5,959,905 to Payne suggests use of a gate array in repair cells, for performing metal-only functional repairs in a cell-based circuit layout design. The repair gate array consists of a group of uncommitted (not interconnected) transistors. A cluster of cells are formed in various locations within the cell-based IC circuit and can be coupled together to form logic function elements. However, this approach requires excessive effort to design the standard logic elements from the transistors of the gate array and excessive amounts of interconnection.

Accordingly, a need still exists for spare gate cells constructed of standard building-block circuits that can be easily configured to achieve a plurality of logic functions, without excessive design work and interconnection and can be readily added to the pre-defined logic circuitry of the operating IC device.

Commonly assigned U.S. Pat. No. 5,696,943 to Lee discusses the need for careful strategy in the design to spare gate cells on a complex IC device, in terms of the type, the location, and the format of the spare gate cells. The types of spare cells should include the most frequently used standard cells in the associated design, since they are most likely to be needed to fix any errors. The spare gates should be grouped with the timing sensitive blocks prior to the place-and-route phase of manufacture, so that they will be located near potential problem gates. Also, the spare gates should be formatted so that they can be easily connected to the problem gates without damaging the existing circuits. For instance, the inputs of spare gates should be tied to either a positive power supply potential or voltage VCC or a ground potential VSS by top layer metal, because as compared to polysilicon or low layer metal, top layer metal is much easier to locate and connect during the place-and-route interconnect processing. Lee also suggests top layer connection for the outputs of the spare gates.

Most current VLSI circuits are constructed with three metal layers. The top layer is metal 3, whereas the bottom level is metal 1. The top layer, metal 3, is exposed and therefore is the easiest to connect to or cut, for changes. Some newer designs even utilize a metal 4 layer, and future designs may add still higher layers. In the spare condition, the inputs of spare gates must be tied to a reference voltage on the chip (Lee), for example to VCC or VSS. In many spare gate cells constructed in the past, this connection would be made through the metal 1 layer. However, such an interconnection makes it difficult to cut the connection to VCC or VSS and reconnect the inputs of the spare gates as needed to implement the desired logic change. As noted, the commonly assigned Patent to Lee does recommend top metal layer connection for the spare gate ports. However, the Lee Patent deals specifically with an IC structure having only two metal layers, i.e. the top layer actually mentioned was only metal 2. Any spare gate strategy for more recent IC designs therefore should maintain a top layer interconnect format, to make the debugging process faster and more reliable.

SUMMARY OF THE INVENTION

The present invention addresses the above stated needs relating to spare gate cell technology by providing a cell design containing both a configurable logic gate and one or more inverters. Inputs of these circuits are accessible at the topmost metal layer on the device, which preferably is metal 3 or higher. When not in use, the metal appearances in the top metal layer enable connections of the inputs to reference voltage. For actual use, the reference voltage connections are selectively cut and new connections made to implement desired logic.

The inventive spare gate cell therefore combines one or more inverter circuits with a configurable logic basic building block circuit. Preferred examples of the configurable logic circuit include a multiplexer and a scannable flip-flop, either of which may be configured differently to perform a plurality of different logic-gate functions. In the spare state, the inputs of all circuits within a cell are tied to a reference voltage, e.g. VCC or VSS, available on the integrated circuit chip using metal 3 or higher. The inputs and outputs of the inverter and the basic building block circuit are not connected together in any particular manner. To use the spare cell, one or more input connections to the reference voltage are cut, and the inputs and outputs are selectively interconnected to each other and/or to signal(s) and element(s) of the pre-defined logic circuit on the chip. The interconnection serves to implement one of several possible gate functions and to interconnect the logic of that gate with circuitry within the pre-defined logic circuit on the chip. For example, with the multiplexer and the inverter(s) it is possible to connect them to form an OR gate, a NOR gate, an AND gate, a NAND gate, etc.; and the ports of such a logic gate are connected to other elements on the chip, to introduce the new logic into that of the existing chip logic.

The combination of a configurable logic circuit, as the basic building block circuit of the spare cell together with the inclusion of one or more inverters within the spare cell provides a particularly high degree of design flexibility in implementing new logic using the spare cell. The use of topmost layer metal, at the metal 3 or higher level, insures ease of access to cut reference voltage connections and implement connections necessary to configure the cell and interconnect the cell to the pre-defined base logic on the chip.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout.

DETAILED DESCRIPTION OF THE BEST MODES

The present invention involves use of one or more spare gate cells on an integrated circuit (IC) device, to enable debug or enhancement of the base logic of the IC device. Each spare gate cell comprises a configurable basic building block circuit formed of interconnected semiconductor devices. The configurable logic circuit is capable of selective operation in one or more modes based on connections of the inputs. Each spare gate cell also includes one or more inverters comprising a plurality of interconnected semiconductor devices formed on the IC. Each of the modes of the basic building block circuit implements a different one of a plurality of possible gate logic functions. The interconnection of the basic building block circuit with one or more of the inverters within the cell enables the cell to provide still further options for implementation of various logic functions. During spare state, all inputs of the building block circuit and all inputs of the one or more inverters within a cell are connected to a reference voltage (e.g. VCC or VSS). In operation, one or more necessary inputs are disconnected from reference voltage and connected as desired to implement one of the many logic functions possible with the combination of the basic building block circuit and the one or more inverters. All of the input and output ports of the inverters and the basic building block circuit are accessible at the topmost metal layer, preferably metal 3 or higher. As such, the spare-state connections to reference voltage use topmost metal layer connections. The subsequent connections to implement a desired logic function and interconnect the circuitry within the functional logic of the IC device also use connections through the topmost metal layer.

Figure 1:
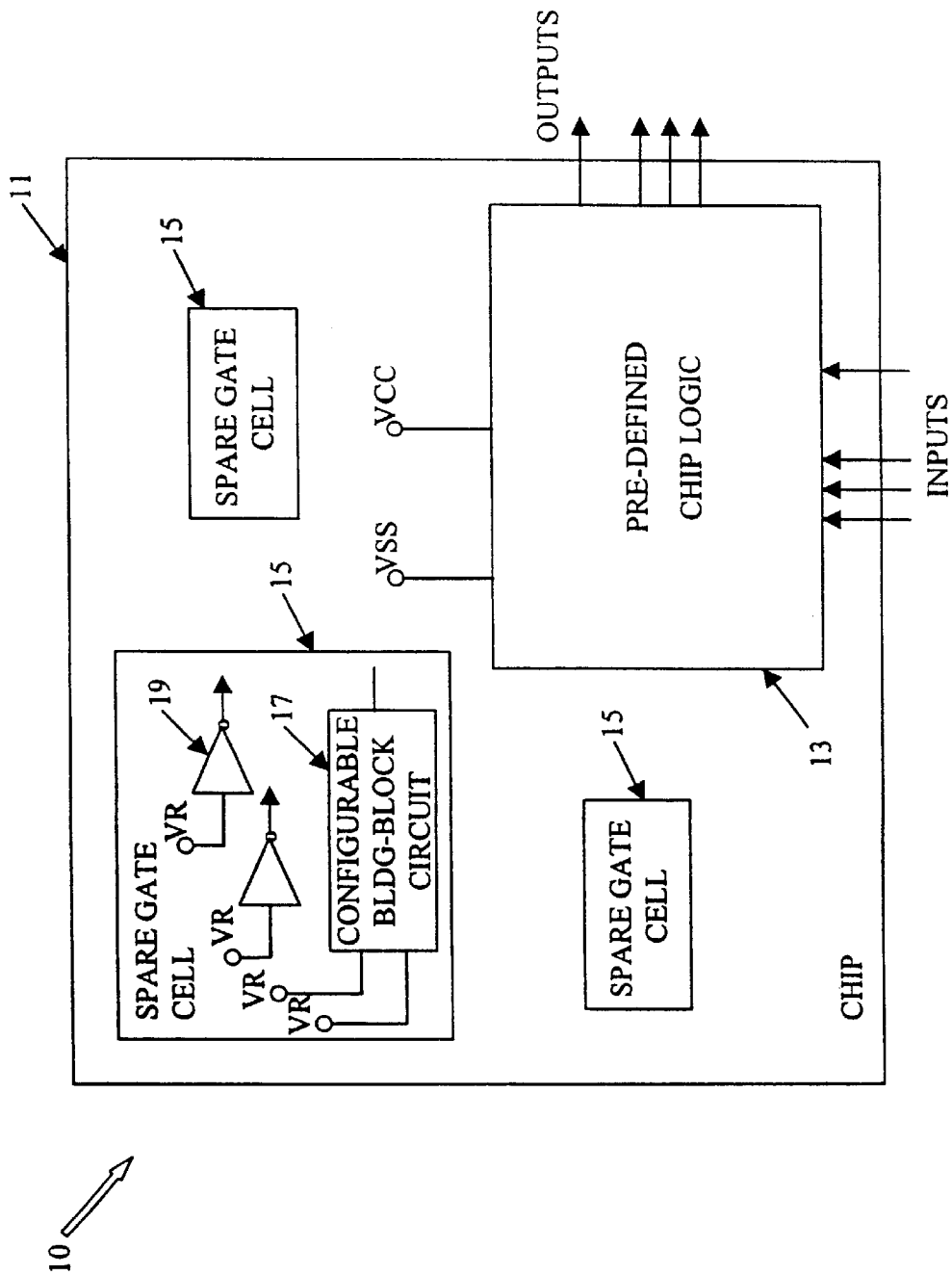
FIG. 1 is a block diagram illustrating an integrated circuit (IC) device incorporating spare gate cells, in accord with the invention.

FIG. 1 provides a block diagram, conceptual illustration of an electronic device incorporating spare gate cells in accord with the present invention. As shown, the electronic device 10 is an integrated circuit formed by VLSI processing on a chip 11. The device 10 includes a pre-defined chip logic 13 formed on the chip 11. The pre-defined logic implements the desired base functionality of the IC chip device. The logic circuit 13 may be virtually any complex logic circuit, such as a microprocessor or the like. In an initial implementation, the logic circuit 13 comprises a network interface controller, typically used in network interface cards (NICs) for terminal devices and/or switches on an Ethernet compliant network.

In practice, engineers design and build the chip with the desired chip logic 13, to meet the requirements of a new product offering. After initial manufacture, a problem or "bug" in the logic 13 may be found. Alternatively, commercial reasons may make it desirable to add to the base logic circuits 13 to enhance the capabilities of the pre-defined logic. The engineers design additional logic to achieve the desired debug or enhancement. Rather than initiate an immediate re-design of the chip logic 13, the engineers can initiate modifications using engineering change orders (ECOs).

The ECOs implement the additional logic, using the spare gate cells 15, to integrate certain new logic functions from one or more of the cells 15 incorporated on the chip 11 during the original manufacturing process. The engineers can test the modified design of the chip, to see if the debug or enhancement is effective. Initially, product may actually be manufactured and sold with the ECO implemented change. However, for going forward, the engineers will redesign the chip logic 13 to incorporate the logic change into that integrated circuitry on the chip. Once the manufacturing process is updated to include the new design for the defined logic 13, use of the spare gate cells is no longer necessary. Those cells 15 once again are available for implementation of further changes to the chip 11.

FIG. 1 also provides a block diagram illustration of one of the inventive spare gate cells. In accord with the invention, each spare gate cell 15 comprises at least two circuits, a configurable building block circuit 17 and one or more inverter circuits 19. In this context, a basic building block circuit 17 is a configurable circuit comprising a number of semiconductor devices capable of selective operation in one or more logic modes, based on connections of the inputs. One preferred example of such a circuit is a multiplexer circuit, configurable to function as different types of combinatorial gate. Another preferred example of the circuit 17 is a scannable flip-flop that configurable to function as different types of flip-flop, e.g. as a normal clocked flip-flop or as a flip-flop with a scanning function. Although less preferred, the configurable building block circuit could use one of the configurable spare gate logic circuits discussed in the background section above. In practice, different sets of the spare gate cells 15 on one chip 11 contain different configurable building block circuits.

FIG. 1 shows an example of one spare gate cell 15 with the circuits 17 and 19 in their spare condition. In practice, the chip 11 is manufactured to include one or more cells 15 with the circuits thereof essentially in the state shown, with the inputs of the various logic configurable building block circuits 17 and the inverters 19 having all of their inputs connected to one of the reference voltage VR available on the chip. In the illustrated example, the pre-defined chip logic uses voltages VSS and VCC. Any of the inputs of the circuits 15 and 17 may be connected to either one of these reference voltages, but all of those inputs connect to one or the other of the reference voltages as the respective reference voltage VR.

Figure 2:
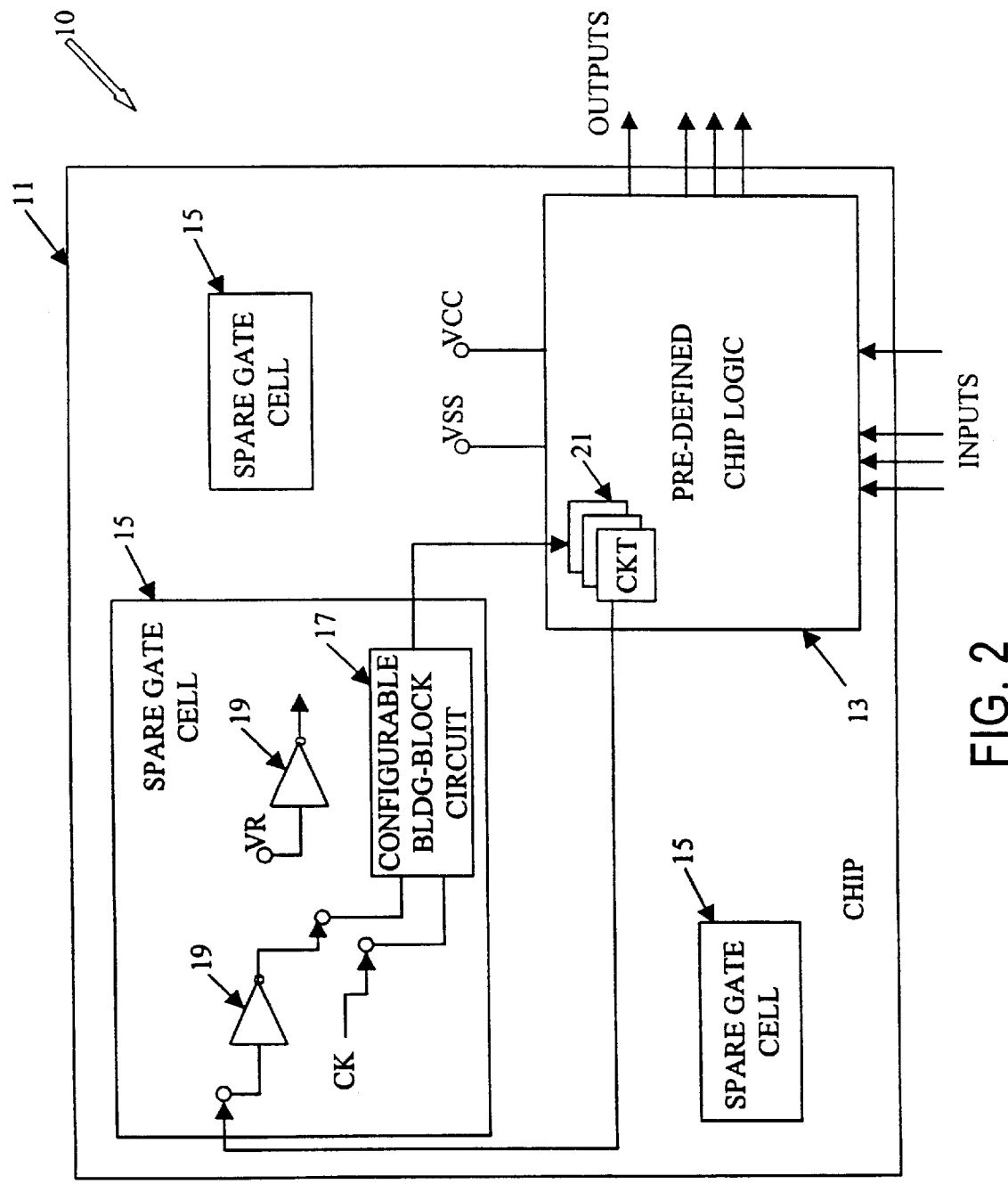
FIG. 2 is a block diagram of the device of FIG. 1 depicting a debug or enhancement of the device to interconnect circuitry from one of the inventive spare gate cells into the pre-defined logic of the IC device.

Each of the inventive spare gate cells can be modified in a place-and-route operation, to eliminate connections to reference voltage and to make necessary input and output connections, to configure the cell to perform a selected one of a plurality of logic gate functions and to interconnect the resulting logic circuit into the base-operational logic circuitry 13 of the device 10. FIG. 2 provides a simplified illustrative example, with one of the gates 15 modified to provide a supplemental logic function and interconnected for operation with circuitry 21 within the pre-defined operational chip logic 13. In the illustrated example, the input connections to reference voltage have been cut for the configurable building block circuit 17 and for one of the available inverters 19. A clock signal (CK) is connected to one input of the configurable building block circuit 17, and the one inverter 19 is connected in series in front of the other input of the configurable building block circuit 17. The input of that inverter 19 connects to the circuitry 21 within the logic 13, and the output of the configurable building block circuit 17 connects to another portion of the circuitry 21. The configuration of the circuit 17 may vary, typically by altering the connections of the inputs thereof. Also, the overall logic achieved within the spare cell will vary by different uses of the one or more inverters 19. An actual logical repair or enhancement to the device 10 typically involves configuration of many of the spare gate cells 15 and interconnection thereof with the pre-defined base logic 13.

Figure 3:
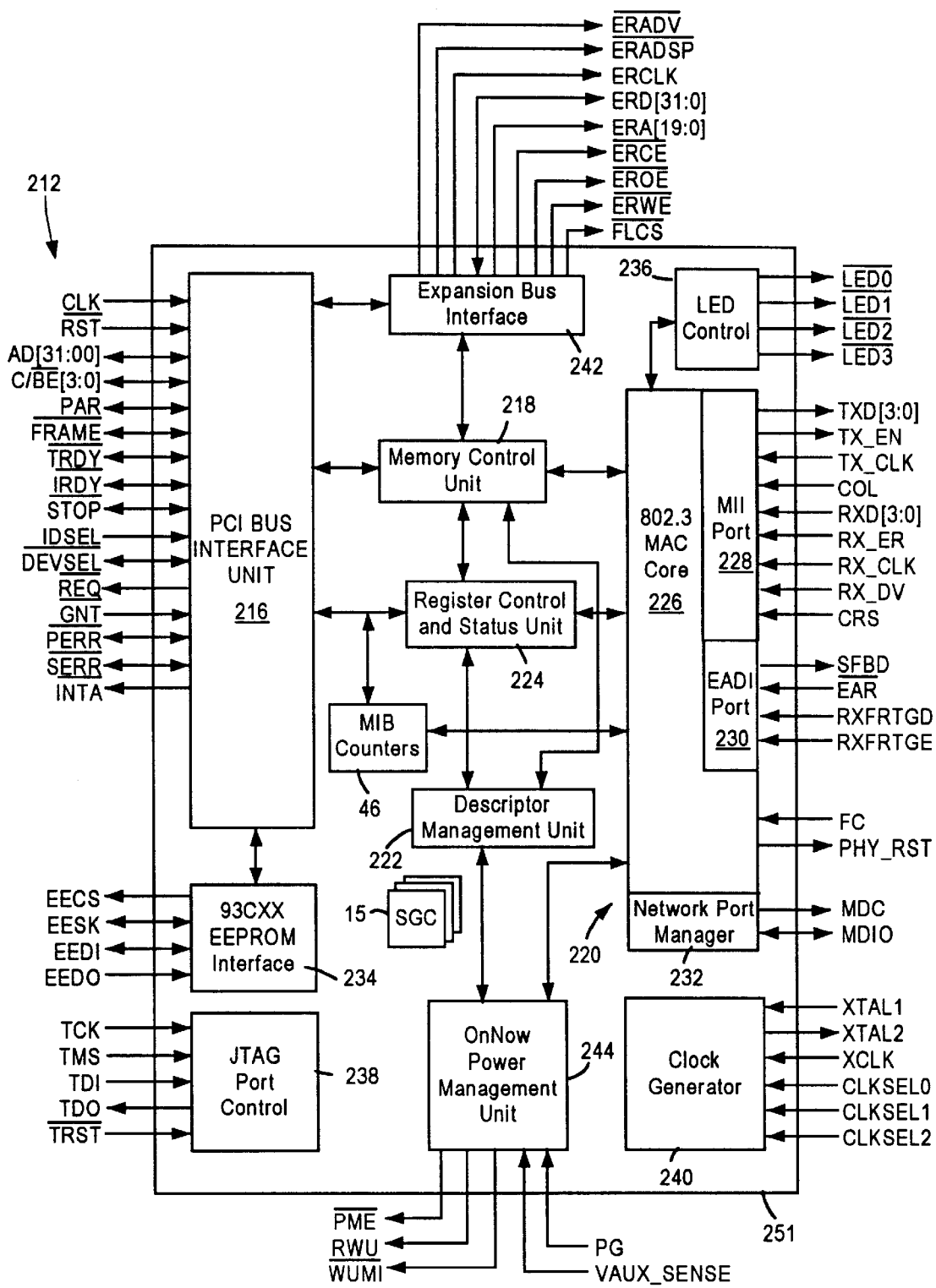
FIG. 3 is a block diagram of a VLSI chip for a network interface controller, incorporating spare gate cells in accord with the present invention.

An initial implementation of the invention involves incorporation of the inventive spare gate cells onto the VLSI chip for such an Ethernet controller. A brief summary of the controller logic follows. FIG. 3 depicts the major components of an exemplary Ethernet controller chip 251, in functional block diagram form.

The network interface controller 251 includes a PCI bus interface unit 216, a memory control unit 218, a network interface portion 220, a descriptor management unit 222 and a register control and status unit 224. The network interface portion 220 includes an IEEE 802.3 compliant and full-duplex capable media access control (MAC) core 226, a Media Independent Interface (MII) port 228 for connecting external 10 Mb/s, 100 Mb/s or 1000 Mb/s transceivers, an External Address Detection Interface (EADI) port 230, and a network port manager unit 232. The network interface controller 251 also includes an EEPROM interface 234 for reading from and writing to an external EEPROM, an LED control 236, an IEEE 1149.1-compliant JTAG Boundary Scan test access port interface 238, a clock generation unit 240, and an expansion bus interface 242. The expansion bus interface unit 242 interfaces to an external memory (e.g., an SRAM) for frame storage and also to non-volatile storage (e.g., an EPROM or Flash memory) for boot programming used during startup.

The PCI bus interface unit 216, compliant with the PCI local bus specification (revision 2.2), receives data frames from a host computer memory via the PCI bus 212. The "host computer" may be any data processing or data communications device needing access to the communication media, for example a personal computer, a workstation, a server, a packet switch, etc. The PCI bus interface unit 216, under the control of the descriptor management unit 222, receives transfers from the host computer via the PCI bus 212. For example, transmit data received from the PCI bus interface unit 216 is passed to the memory control unit 218, which stores it in the data memory. Subsequently, the memory control unit 218 retrieves the transmit data from the data memory and passes it to the MAC core 226 for eventual transmission to the network. Similarly, receive data from the network is processed by the MAC core 226 and passed to the memory control unit 218 for storage in the data memory.

Subsequently, the memory control unit 218 retrieves the receive data from the data memory and passes it to the PCI bus interface unit 216 for transfer to the host computer, in the case the switch logic, via the PCI bus 212.

The descriptor management unit 222 manages the transfers of data to and from the host computer via the PCI bus interface unit 216. Data structures contained in the memory of the host computer specify the size and location of data buffers along with various control and status information. The descriptor management unit 222 interfaces with the memory control unit 218 to insert control information into the transmit data stream and to retrieve status information from the receive data stream.

The network interface portion 220 includes a network port manager 232 that performs auto-negotiation functions by communicating via the media with a corresponding auto-negotiation unit in the link partner (e.g., for a centralized hub, repeater, workstation, or other switch).

In the preferred embodiment of the invention, the exemplary Ethernet controller chip 251 also incorporates a number of the inventive spare gate cells (SGCs) 15 at various strategic locations within the chip. For convenience, only one group of such cells 15 appears in the block diagram, although those skilled in the art will recognize that the actual device will include many more of such cells. The spare cells will contain various configurable logic circuits in combination with one or more inverters. A preferred embodiment of the controller 251 includes cells with a multiplexer and three inverters as well as cells with a scannable flip-flop and an inverter.

Figure 4:
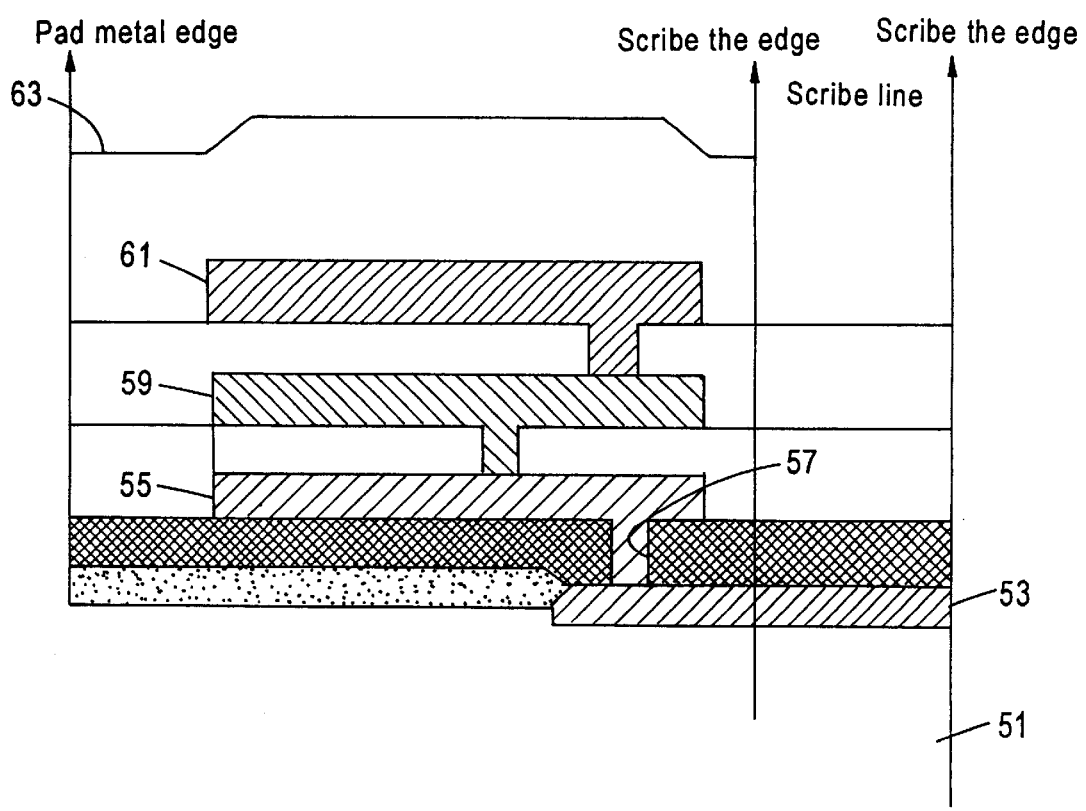
FIG. 4 is a cross-section of a portion of a chip, for implementing an IC in accord with the invention, showing the layers on top of the substrate, which is helpful in understanding the metalizations utilized in the inventive spare gate cells.

FIG. 4 shows a cross-section through a portion of a VLSI type IC device, which may implement the spare gate technology in accord with the invention. As shown, a component of the device includes a diffusion region 53 formed in the substrate 51. The region, for example, could be the source or drain of a transistor of a gate circuit, an inverter or the like. Current VLSI devices often are constructed with three metal layers, although the device may include higher metal layers. In the illustrated implementation, the device includes three metal layers for interconnections. The top layer is metal 3, whereas the bottom level is metal 1. The lowest metal layer, metal 1 (55) extends through a via 57 to contact the actual element of the logic circuit, in this case the diffusion region 53 formed in the substrate 51.

Normal gates (inside a standard cell) have input and output ports connected through metal layer 1. However, the input and output ports of a spare cell connect to the top layer, metal 3. The output ports of the spare cells may also appear at the lower metal layers. Hence, if the element contacted (region) 53 is an input or output of a circuit within a spare gate cell, the element will have connections through the various metal layers to the topmost metal layer. In the illustrated example, connections extend from the metal layer (55) upward through metal 2 (59) to metal 3 (61). A passivation layer 63 covers the topmost metal layer 61. Prior to application the passivation layer, the top layer, metal 3, is exposed and therefore is the easiest to connect to or cut, for changes. In accord with the invention, the inputs of circuits within the spare gate cell connect through metal 3 (61) to reference voltage VR, which may be either VCC or VSS, when the circuit is a spare. The connection through metal 3 (61) is cut or otherwise eliminated and replaced with a new metal 3 connection, to implement desired logic functions using the building block circuit and/or one or more of the inverters of the spare cell.

In practice, interconnection 5 are made with an APR (automatic place and route) tool. Spare cells only have inputs that are understandable or accessible by the APR tool at the metal 3 layer. The outputs are understandable or accessible by the APR tool at each of the three metal layers. Both are connected from metal 1 to metal 3, but the APR tool only recognizes the outputs as accessible at all three layers. The inputs are recognized as accessible only at the top metal layer, metal 3 in the illustrated example.

Figure 5:
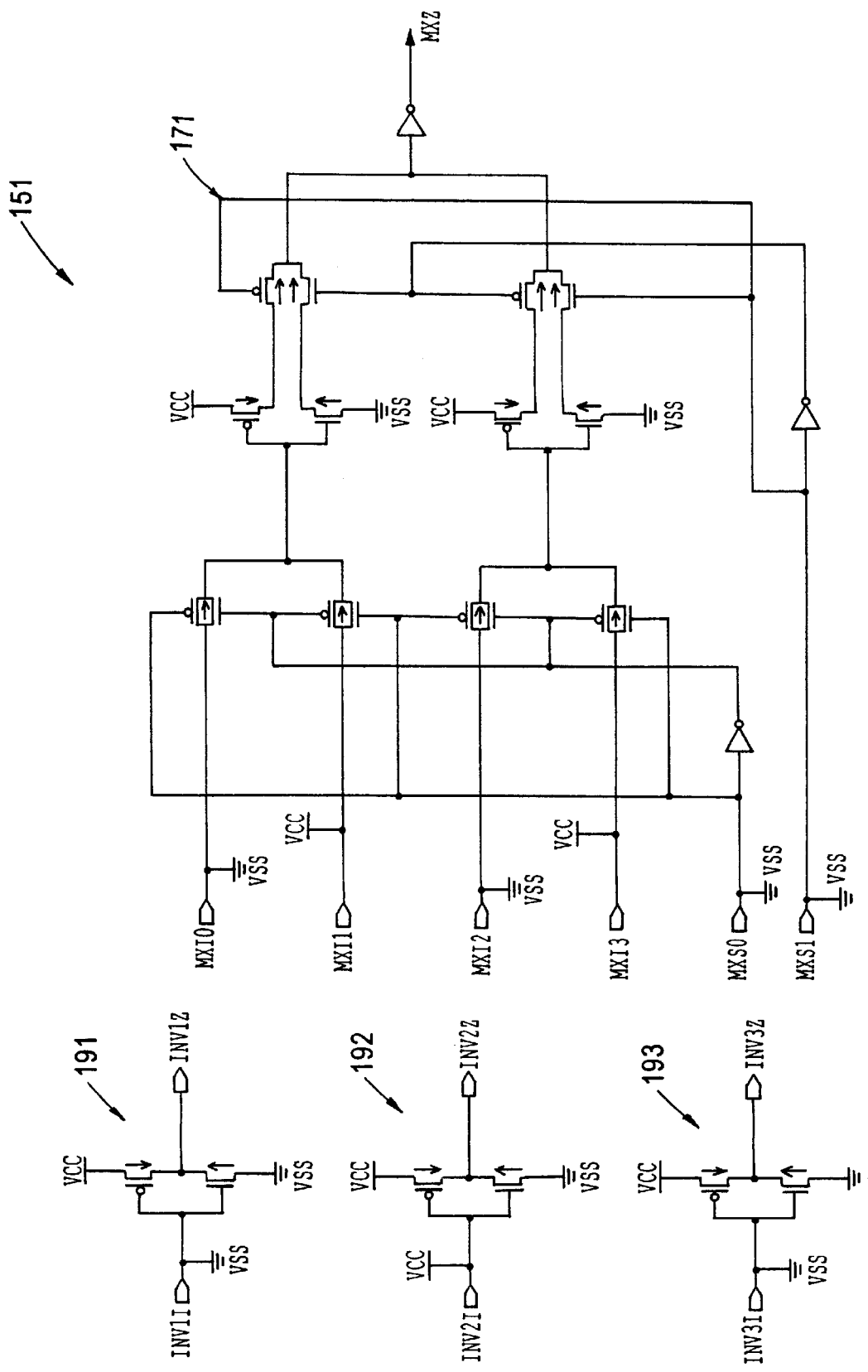
FIG. 5 is a logic circuit diagram of an inventive spare gate cell for implementing combinatorial gate logic functions. This drawing shows the cell in the "spare" condition.

FIG. 5 is a circuit diagram of a first example of a spare gate cell implemented in accord with the present invention. As shown, the spare gate cell 151 includes a configurable basic building block circuit 171. In this embodiment, the basic building block circuit 171 is four input multiplexer or selection circuit. The 4-to-1 multiplexer is a known building block circuit. In accord with the invention, the inputs are connected in various configurations to implement different combinatorial logic functions.

The spare cell 151 also includes three inverters 191–193. Each inverter circuit includes a plurality of interconnected semiconductor devices. The illustrated inverters utilize two transistors formed on the IC chip, although a variety of other known circuits may be used to form the inverters.

FIG. 5 shows the cell 151 in the spare state. In this condition, none of the circuits within the cell are in use. In this spare state, the inverters and the multiplexer are not interconnected to each other. All of the outputs are floating (no connections). The various circuit inputs are tied to a reference voltage.

Although all of the inputs could be tied to the same reference voltage, in the illustrated example, some of the inputs use VCC as the reference voltage, and other circuit inputs connect to VSS as the reference voltage. Specifically, metal 3 connects the input INV1I of the inverter 191 and the input INV3I of the inverter 193 to voltage VSS. Similarly, metal 3 connects the input INV I2 of the inverter 192 to voltage VCC. The multiplexer 171 has two of its logic inputs tied to VSS and two tied to VCC. Specifically, metal 3 connects the inputs MXI0 and MXI2 to voltage VSS, and metal 3 connects the inputs MXI1 and MXI3 to voltage VCC. In this example, metal 3 also provides a connection for each of the selection inputs MXS0, MXS1 to voltage VSS.

Figure 6:
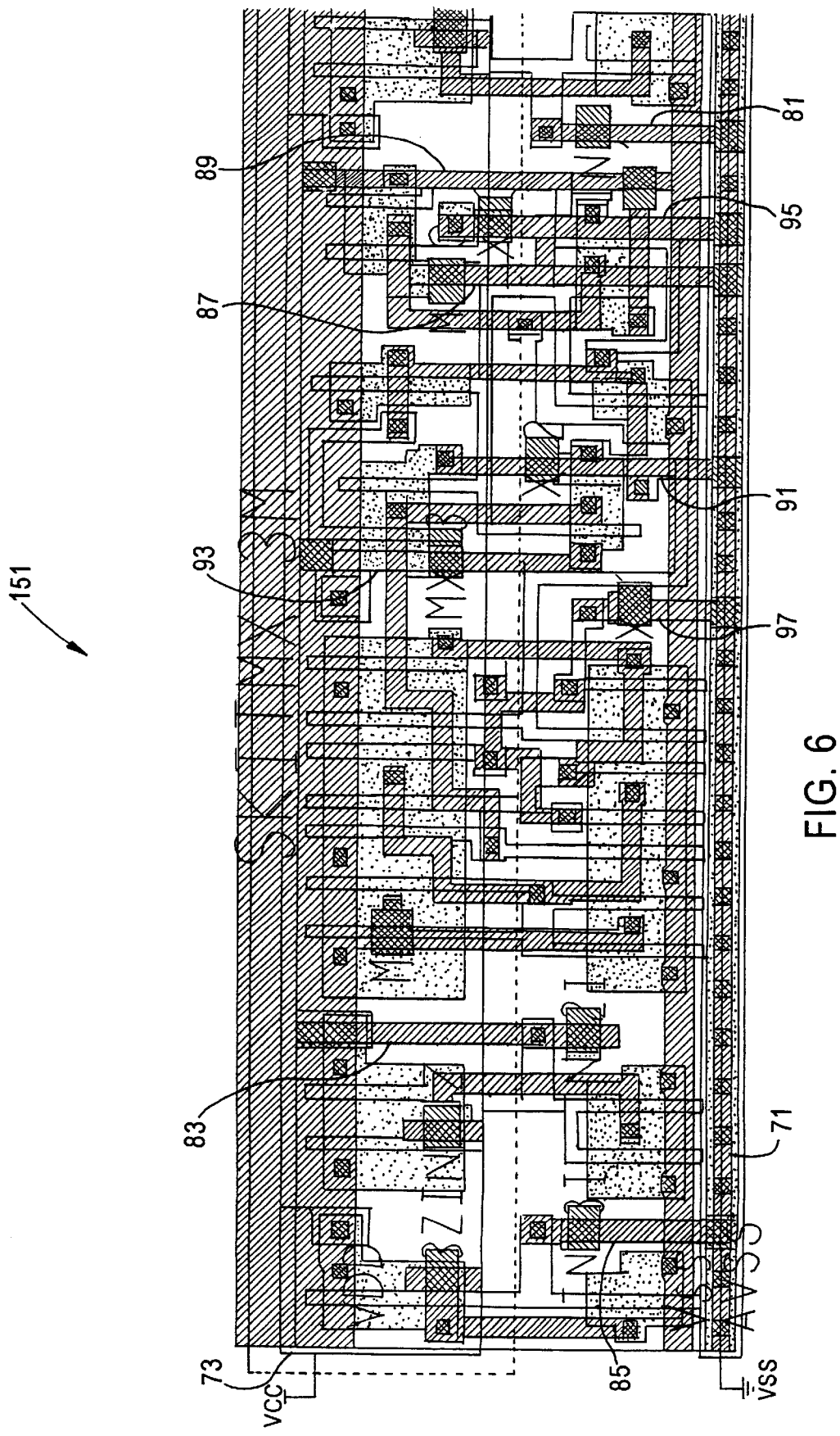
FIG. 6 is a physical layout diagram of the spare gate cell of FIG. 5.

FIG. 6 is a layout diagram of the spare gate cell 151 on an actual VLSI chip. The reference voltages appear along lines adjacent each boundary of the cell 151. The VSS voltage appears at 71 just outside one boundary (lower edge), and the VCC voltage appears at 73 just outside the other boundary (upper edge). In the illustrated example, a metal 3 lead 81 connects the input INV1I of the first inverter to voltage VSS, along the lower edge in the drawing. A metal 3 lead 83 connects the input INV2I of the second inverter to VCC, along the upper edge in the drawing. A metal 3 lead 85 connects the input INV3I of the third inverter to voltage VSS.

A metal 3 layer lead 87 connects the input MXI0 to voltage VSS 71 along the bottom edge of the cell, and a metal 3 layer lead 89 connects the input MXI1 to voltage VCC along the top edge of the cell. Similarly, a metal 3 layer lead 91 connects the input MXI2 to voltage VSS, and a metal 3 layer lead 93 connects the input MXI3 to voltage VCC. In this example, a metal 3 lead 95 provides a connection for selection input MXS0 to voltage VSS, and a metal 3 lead 97 provides a connection for selection input MXS1 to voltage VSS.

In operation of a spare cell of the type shown in FIG. 5, signals on the MXS0 and MXS1 ports (2-bit input) would cause the multiplexer circuit 171 to select one of four of the MXI inputs. For example, if the select inputs are MXS0=0 and MXS1=0, the output MXZ will correspond to the signal on the MXI0 line. The following truth table (Table 1) shows the input selection logic for the multiplexer. The MXZ column in Table 1 identifies the input supplied through the circuit to the output for each of the four possible 2-bit input states.

TABLE 1

| MXS1 | MXS0 | MXZ | NAND | AND |
|------|------|------|------|-----|
| 0 | 0 | MXI0 | 1 | 0 |
| 0 | 1 | MXI1 | 1 | 0 |
| 1 | 0 | MXI2 | 1 | 0 |
| 1 | 1 | MXI3 | 0 | 1 |

Table 1 also includes two columns showing examples of logic gate outputs for the 2-bit inputs, in this case for a NAND gate and an AND gate. Essentially, it is possible to use the selection inputs (MXS) of the multiplexer 171 as the logic inputs of the simulated gate. To achieve the desired truth table for the logic circuit output, the data inputs (MXI) are tied to the appropriate voltages VCC or VSS for the desired 0 and 1 values. For example, for a gate that should output a 0 if both inputs are 0, the MXI0 input would be connected to the voltage for the binary value of 0 (VSS). Conversely, for a gate that should output a 1 if both inputs are 0, the MXI0 input would be connected to the voltage for the binary value of 1 (VCC).

Figure 7:
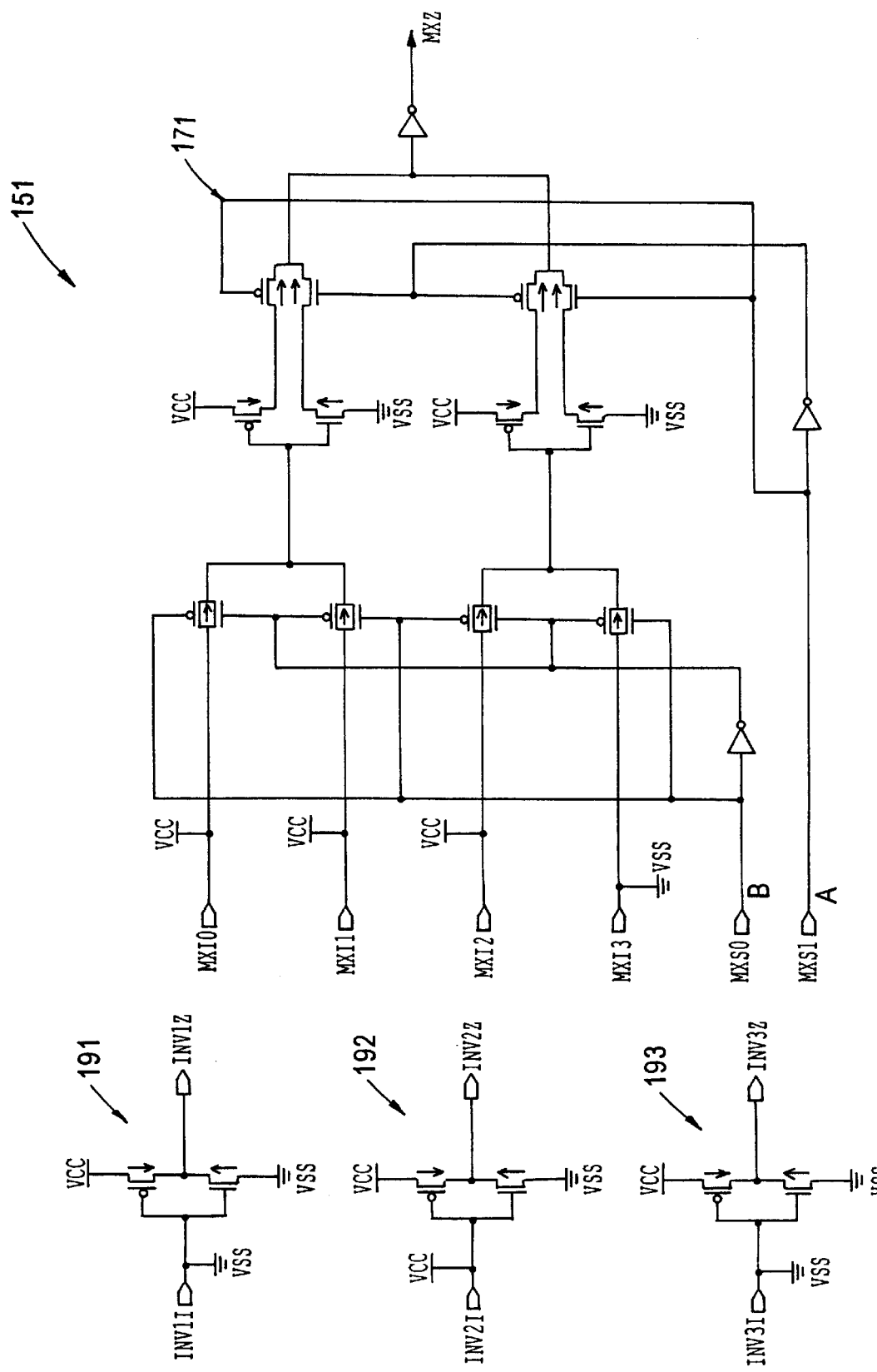
FIG. 7 is a logic circuit diagram of the spare gate cell of FIG. 5 modified to implement a NAND logic function.

In use, the connections to VCC and/or VSS are cut, and the ports are reconnected to other voltages and to elements on the chip, to implement desired logic and to add the resultant logic from the spare cell into the base logic on the chip, for example to test a logic-debug or a proposed logic enhancement. FIG. 7 is a circuit diagram of the input connections for the cell 151, when modified so that the multiplexer circuit 171 operates as a NAND gate. The operation of the circuit 171 corresponds to the selections shown in the fourth column (NAND) of Table 1. In this example, the MXI0 input, the MXI1 input and the MXI2 input all are connected to 1, that is to say to the voltage line for VCC. The MXI3 input is connected to 0, i.e. to the ground voltage VSS. If the input values on A and B are both 1, then the output is 0 (from the MXI3 input). Otherwise, the gate outputs a 1. The AND gate example would involve connection of the MXI0 input, the MXI1 input and the MXI2 input to 0 and connection of the MXI3 input to 1 (See again table 1).

The exemplary NAND gate logic does not require use of any of the inverters. Hence, the inverter inputs remain connected to reference voltages VCC, VSS in the manner illustrated in FIG. 5. The MXI1 input also remains connected to VCC, as in the spare condition. However, the reference voltage connections to the other inputs of the multiplexer circuit 171 have changed. For the logic inputs MXI0, MXI2 and MXI3, the APR tool makes a new connection to the respective voltages as shown in FIG. 7. The APR tool also makes connections as necessary for the MXS0, MXS1 inputs to the source(s) for supplying the input logic values the A and B inputs for the NAND gate, and the tool makes an appropriate connection from the MXZ output to the desired point in the predefined logic 13 on the chip 11.

Figure 8:
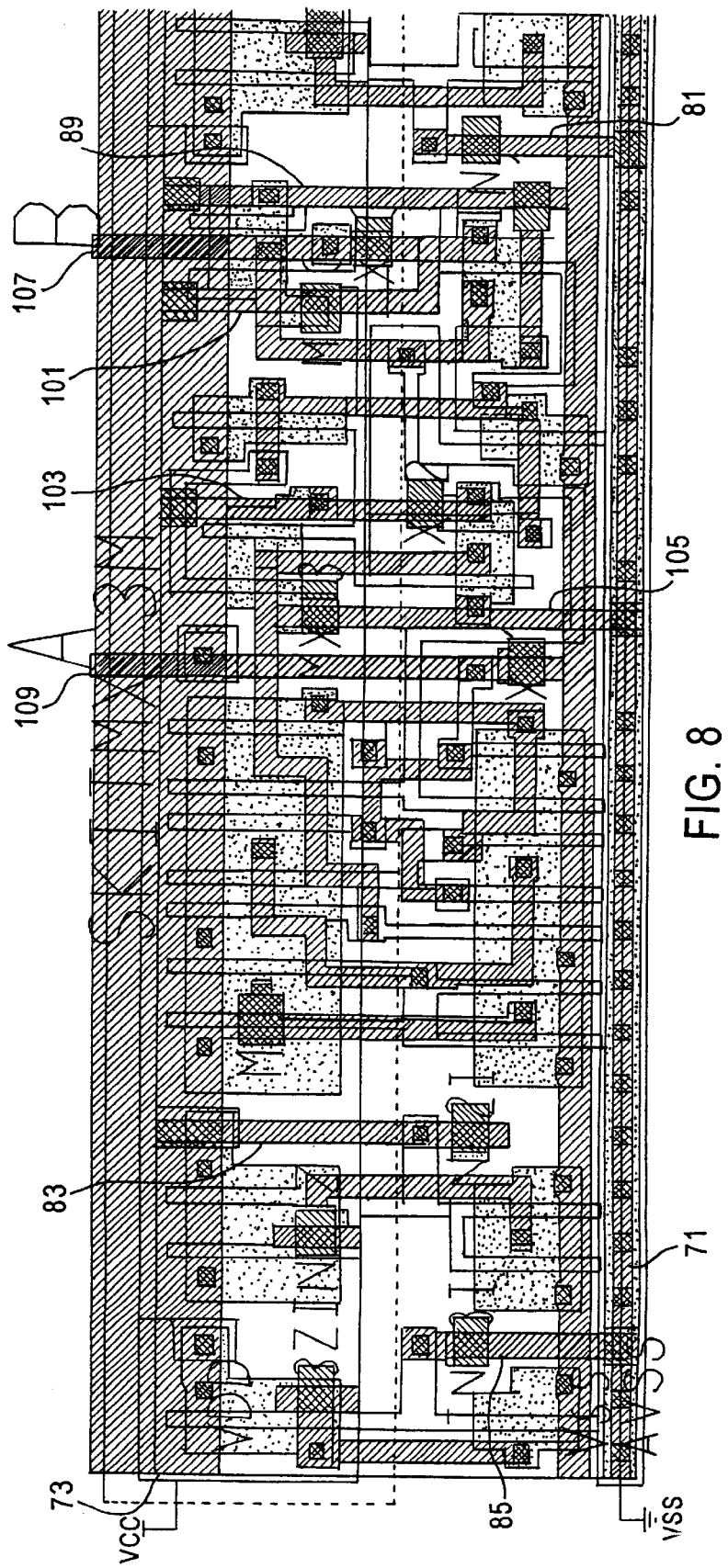
FIG. 8 is a layout diagram of the spare gate cell of FIG. 7, i.e. showing the modified metalizations to implement the NAND function from the spare cell.

FIG. 8 is a layout diagram of the spare gate cell 151 on an actual VLSI chip, showing the implementation of a NAND gate per the circuit diagram of FIG. 7. Since the inverters are not in use in this example, the metal 3 lead 81 still connects the input INV1I of the first inverter to voltage VSS at 71; the metal 3 lead 83 still connects the input INV2I of the second inverter to VCC 73; and the metal 3 lead 85 still connects input INV3I of the third inverter to voltage VSS at 71.

The metal 3 layer lead 89 still connects the input MXI1 to voltage VCC 73 along the top edge of the cell. However, the metal leans 87, 91 and 93 (FIG. 5) for three of the MXI logic inputs have been removed or cut. The metal 3 layers leads 95 and 97 to the selection inputs MXS0, MXS1 also have been removed or cut.

A new metal 3 layer lead 101 now connects the input MXI0 to voltage VCC 73 along the upper edge of the cell, and a metal 3 layer lead 103 connects the input MXI2 to voltage VCC. Similarly, a metal 3 layer lead 105 now connects the input MXI3 to voltage VSS 71 adjacent the lower edge of the cell in the drawing. In this example, a metal 3 lead 107 provides a connection for selection input MXS0, to serve as the B input of the NAND gate. A metal 3 layer lead 109 provides a connection for selection input MXS1, to serve as the A input of the gate.

Although not shown in FIGS. 7 and 8, those skilled in the art will recognize that a particular result can be inverted by adding an inverter, either on the input side or the output side. It may be desirable to add inverters to increase the drive of the gate or to change the timing of the gate.

Figure 9:
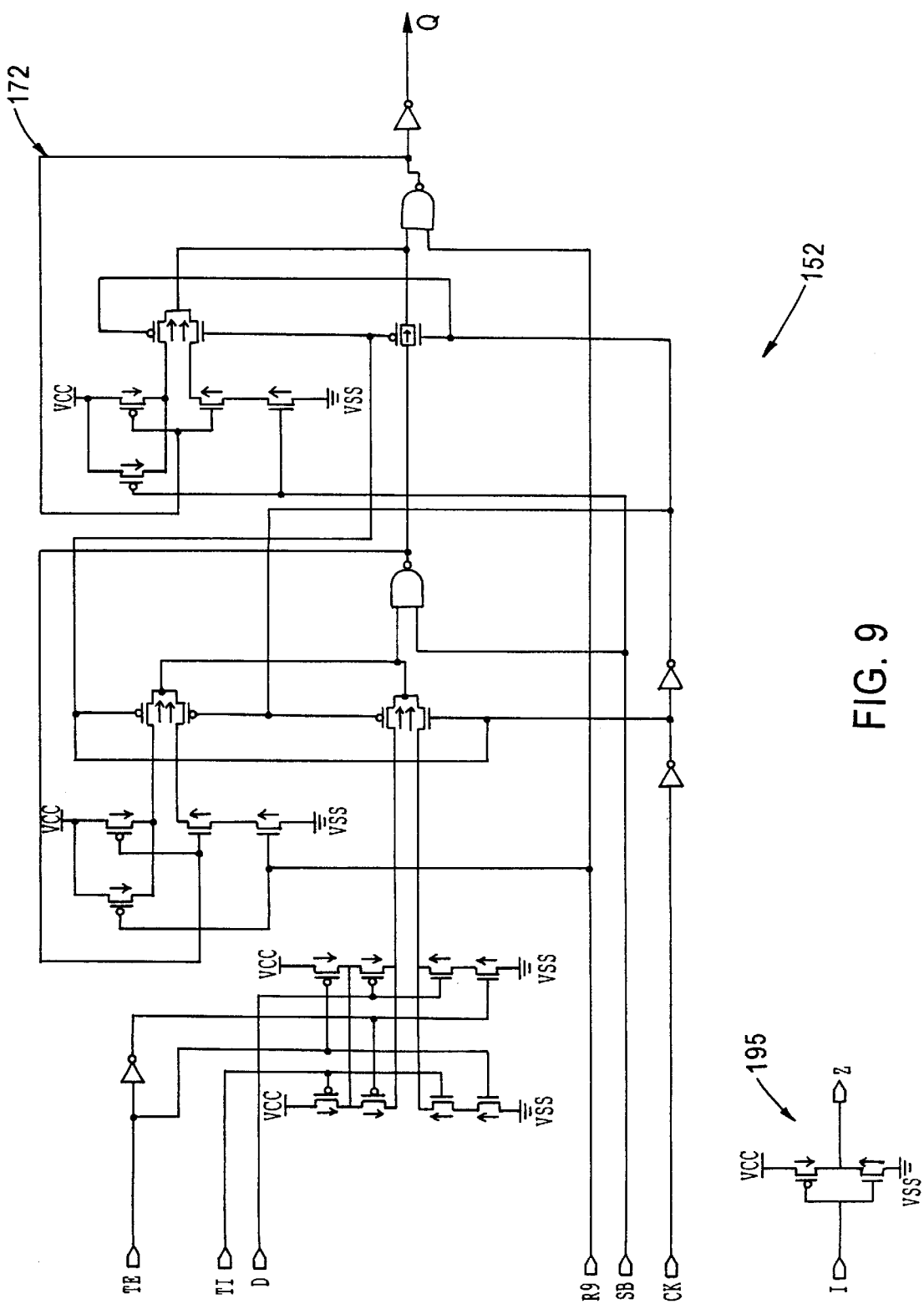
FIG. 9 is a logic circuit diagram of an inventive spare gate cell for implementing sequential gate logic functions.

FIG. 9 depicts another implementation 152 of a spare gate cell, in this case for a sequential gate. The illustrated cell 152 includes a scannable flip-flop 172 as the reconfigurable, basic building block circuit 172. In addition to the reconfigurable, basic building block circuit 172, the cell 152 includes one inverter circuit 195. The spare cells on a particular IC chip typically will all have similar size or surface area. The reconfigurable circuit 172 in the cell 152 is somewhat larger than the multiplexer in the earlier embodiment, therefore the exemplary cell 152 includes room only for one inverter. Those skilled in the art will recognize that the cell could contain additional inverters if there was additional real estate available on the chip or if the circuit 172 occupied a smaller area.

For convenience, connections to the inputs and outputs of the circuits 172, 195 have been omitted from this drawing. In accord with the invention, the inputs connect through metal layer 3 to either VCC or VSS, when the cell is a spare and not in use. The reference voltage connections are eliminated, and new connections made as necessary to implement particular logic.

The scannable flip-flop 172 may operate as a normal flip-flop, or it may operate as a flip-flop with a scanning function, depending on how the inputs are connected. For example, for a simple flip-flop function, the D lead becomes the circuit input, and the clock signal is applied to the CK lead. The circuit outputs the value on the D input from the Q output at the time of the right edge of the clock signal. The flip-flop therefore outputs values applied to D in the sequence controlled by the clock, i.e. as a standard clocked sequential gate. To provide an inverted flip-flop function, the inverter is simply connected in-series in front of the D input lead. Specifically, during the circuit editing process, the Z-output of the inverter 195 is connected at the metal 3 layer to the D input of the flip-flop circuit 172. Input data for the cell 152 is applied to the I-input of the inverter 195. To provide both inverting and non-inverting outputs, the inverter could be connected as a parallel output from the Q output lead.

Consider now a summary of a method of implementing the inventive spare gate strategy. In the spare condition inputs must be tied to VCC or VSS. In the past, this connection would be made through metal 1. It therefore was difficult to cut the connection to VCC or VSS and reconnect the inputs as needed to implement the desired logic change. However, in accord with the invention, in the spare condition, the top metal layer 3 provides a connection for each of the inputs of the cell to ground (VSS) or power VCC.

In practice a manufacturer of the VLSI device produces the pre-defined logic for the device in silicon, for example, the network interface controller of FIG. 3. The chip includes a number of versions of inventive spare gate cells, some of which include the multiplexer, some of which include the scannable flip-flop and some of which contain other configurable logic circuits. Later, the manufacturer finds a bug or desires an enhancement. The engineers design additional logic to achieve the debug or the desired enhancement. The engineers first implement and test the additional logic by adding in logic by fib-milling existing chips to add logic from one or more of the inventive spare gates. If the proposed modification achieves desired results, the engineers can later redesign the circuitry on the silicon for a permanent fix in subsequent generations of the product.

The basic building block circuits included in the spare gate cells provide considerable flexibility of logic function selection. However, the inverters provide additional design flexibility. The inverters may serve as a buffer for timing or to increase the drive function. Alternatively, the inverters may serve as a NOT function on an input or output of a logic circuit. The configurable building block circuit and the inverters may be used individually or in various combinations, to implement desired logic changes.

Those skilled in the art will recognize that actual embodiments of the invention admit of a wide range of modifications without substantial departure from the inventive concepts. For example, the drawings illustrate the two currently preferred types of configurable building block circuit, the multiplexer and the scannable flip-flop. Obviously, other reconfigurable logic circuits could be used. Similarly, the designer may opt to include more inverter circuits in any particular application of a spare gate cell.

While the inventions have been described in connection with what is presently considered to be the most practical and preferred embodiments, it is to be understood that the inventive concepts are not limited to the disclosed embodiments, but, on the contrary, are intended to cover various modifications and equivalent arrangements included within the spirit and scope of the appended claims.

What is claimed is:

1. A spare gate cell formed on an integrated circuit chip, for use in modification of functionality of a pre-defined logic circuit formed on the integrated circuit chip, the spare gate cell comprising:
   a configurable building block circuit having at least two input leads and an output lead, the configurable building block circuit being capable of selectively performing a plurality of possible logic functions on signals appearing on the input leads to produce a logic signal on the output lead, selection of a function from the plurality of possible logic functions depending on connections of the input leads of the configurable building block circuit;
   an inverter having an input and an inverted signal output; and
   a multi-layer interconnection structure comprising a plurality of layers of metal formed on the integrated circuit chip,
   wherein the input leads of the configurable building block circuit and the input of the inverter all have accessible appearances at a top-most one of the layers of metal of the interconnection structure.

2. A spare gate cell as in claim 1, wherein the plurality of layers of metal comprise at least three layers of metal formed at successively higher levels above a surface of the integrated circuit chip, and the top-most one of the layers of metal comprises a third or higher layer metal.

3. A spare gate cell as in claim 1, wherein the configurable building block circuit comprises a multiplex selection circuit.

4. A spare gate cell as in claim 3, wherein the multiplex selection circuit comprises a 4-to-1 multiplexer having four data inputs and two-bit binary selection inputs.

5. A spare gate cell as in claim 4, wherein the multiplexer functions as a selected combinatorial gate with logic input signals applied to the two-bit binary selection inputs and logic values corresponding to various values desired for the applied logic input signals being defined by reference voltages applied to the four data inputs.

6. A spare gate cell as in claim 1, wherein the configurable building block circuit comprises a scannable flip-flop.

7. A spare gate cell as in claim 6, wherein the scannable flip-flop is selectively configurable as a clocked flip-flop and a flip-flop with a scanning function.

8. A spare gate cell as in claim 1, further comprising another inverter having an input with an accessible appearance at the top-most one of the layers of metal of the interconnection structure and having an inverted signal output.

9. A spare gate cell as in claim 1, wherein the output of the configurable building block circuit and the output of the inverter have accessible appearances at least at the top-most one of the layers of metal of the interconnection structure.

10. An integrated circuit device, comprising:
    a pre-defined logic circuit formed on an integrated circuit chip; and
    a plurality of spare gate cells formed on the integrated circuit chip, for use in modification of functionality of the pre-defined logic circuit; and
    a multi-layer interconnection structure comprising a plurality of metal layers formed one above another on the integrated circuit chip,
    each spare gate cell comprising:
    a configurable building block circuit having at least two input leads and an output lead, the configurable building block circuit being capable of selectively performing a plurality of possible logic functions on signals appearing on the input leads to produce a logic signal on the output lead, selection of a function from the plurality of possible logic functions depending on connections of the input leads of the configurable building block circuit; and
    an inverter having an input and an inverted signal output;
    wherein the input leads of the configurable building block circuit and the input of the inverter all have accessible appearances at a top-most one of the metal layers of the interconnection structure.

11. An integrated circuit device as in claim 10, wherein the multi-layer interconnection structure comprises at least three layers of metal formed one above another on the integrated circuit chip.

12. An integrated circuit device as in claim 10, wherein the configurable building block circuit of at least one of the spare gate cells comprises a multiplex selection circuit.

13. An integrated circuit device as in claim 12, wherein the multiplex selection circuit comprises a 4-to-1 multiplexer having four data inputs and two-bit binary selection inputs.

14. An integrated circuit device as in claim 13, wherein the multiplexer functions as a selected combinatorial gate with logic inputs applied to the two-bit binary selection inputs and logic values corresponding to various values desired for the applied logic inputs being defined by reference voltages applied to the four data inputs.

15. An integrated circuit device as in claim 10, wherein the configurable building block circuit of at least one of the spare gate cells comprises a scannable flip-flop.

16. An integrated circuit device as in claim 15, wherein the scannable flip-flop is selectively configurable as a clocked flip-flop and a flip-flop with a scanning function.

17. An integrated circuit device as in claim 10, wherein at least one of the spare gate cells further comprises another inverter having an input with an accessible appearance at the top-most one of the layers of metal of the interconnection structure and having an inverted signal output.

18. An integrated circuit device as in claim 10, wherein the output of the configurable building block circuit and the output of the inverter have accessible appearances at least at the top-most one of the layers of metal of the interconnection structure.

19. An integrated circuit device as in claim 10, wherein:
the configurable building block circuit of at least one of the spare gate cells comprises a multiplexer, and
the configurable building block circuit of at least one other one of the spare gate cells comprises a scannable flip-flop.

20. An integrated circuit device as in claim 10, wherein the pre-defined logic circuit comprises a network interface controller.

21. An integrated circuit device, comprising:
a network interface controller circuit formed on an integrated circuit chip, the network interface controller circuit comprising a bus interface unit for providing data communications with a host system and a network interface unit coupled to the bus interface for providing data communications through a physical transceiver to and from a communication media; and
a plurality of spare gate cells formed on the integrated circuit chip, for use in modification of functionality of the pre-defined logic circuit; and
a multi-layer interconnection structure comprising at least three layers of metal formed on the integrated circuit chip,
each spare gate cell comprising:
a configurable building block circuit comprising a plurality of semiconductor devices formed on the integrated circuit chip, the configurable building block circuit having at least two input leads and an output lead, the configurable building block circuit being capable of selectively performing a plurality of possible logic functions on signals appearing on the input leads to produce a logic signal on the output lead, selection of a function from the plurality of possible logic functions depending on connections of the input leads of the configurable building block circuit; and
an inverter comprising a plurality of semiconductor devices formed on the integrated circuit chip, said inverter having an input and an inverted signal output;
wherein:
the input leads of the configurable building block circuit and the input of the inverter all have accessible appearances at a top-most one of the layers of metal of the interconnection structure, and
at least two of the configurable building block circuits are different from each other and are configurable to perform different pluralities of possible logic functions.

22. An integrated circuit device as in claim 21, wherein the configurable building block circuit of at least one of the spare gate cells comprises a multiplexer having a plurality of data inputs and at least one selection input.

23. An integrated circuit device as in claim 21, wherein the configurable building block circuit of at least one of the spare gate cells comprises a scannable flip-flop.

24. An integrated circuit device as in claim 21, wherein:
the configurable building block circuit of at least one of the spare gate cells comprises a multiplexer; and
the configurable building block circuit of at least another one of the spare gate cells comprises a scannable flip-flop.

* * * * *